US012751055B2

(12) United States Patent

Zhang et al.

(10) Patent No.: US 12,751,055 B2
(45) Date of Patent: Sep. 29, 2026

(54) CELL STRUCTURES OF INSULATED GATE BIPOLAR TRANSISTOR IGBT WITH A CONTROL GATE AND A CARRIER STORAGE LAYER, AND THEIR MANUFACTURING METHODS

(71) Applicants: Nexperia Technology (Shanghai) Ltd., Shanghai (CN); NEXPERIA B.V., Nijmegen (NL)

(72) Inventors: Xukun Zhang, Shanghai (CN); Chunlin Zhu, Shanghai (CN); Ke Jiang, Shanghai (CN)

(73) Assignees: Nexperia Technology (Shanghai) Ltd., Shanghai (CN); Nexperia B.V., Nijmegen (NL)

( * ) Notice: Subject to any disclaimer, the term of this patent is extended or adjusted under 35 U.S.C. 154(b) by 403 days.

(21) Appl. No.: 18/361,141

(22) Filed: Jul. 28, 2023

(65) Prior Publication Data

US 2024/0038835 A1 Feb. 1, 2024

(51) Int. Cl.

| | |
|---|---|
| ***H10D 62/10*** | (2025.01) |
| ***H10D 12/00*** | (2025.01) |
| ***H10D 12/01*** | (2025.01) |
| ***H10D 62/17*** | (2025.01) |
| ***H10P 30/20*** | (2026.01) |

(52) U.S. Cl.

CPC ......... *H10D 62/109* (2025.01); *H10D 12/038* (2025.01); *H10D 12/481* (2025.01); *H10D 62/393* (2025.01); *H10P 30/204* (2026.01); *H10P 30/21* (2026.01)

(58) Field of Classification Search

CPC .. H10D 62/109; H10D 12/481; H10D 12/038; H10D 62/393; H01L 21/26513

See application file for complete search history.

(56) References Cited

U.S. PATENT DOCUMENTS

| | | | | |
|---|---|---|---|---|
| 2008/0197379 | A1* | 8/2008 | Aono | H10D 12/038 257/E29.066 |
| 2014/0209972 | A1* | 7/2014 | Sumitomo | H10D 64/511 257/140 |
| 2016/0020287 | A1* | 1/2016 | Hirler | H10D 12/00 257/331 |
| 2017/0194484 | A1* | 7/2017 | Zundel | H10D 62/393 |
| 2019/0148532 | A1* | 5/2019 | Naito | H10D 8/422 257/330 |
| 2021/0296475 | A1* | 9/2021 | Iwakaji | H10D 62/106 |

* cited by examiner

*Primary Examiner* — Norman D Richards
*Assistant Examiner* — Sean Ayers Winters
(74) *Attorney, Agent, or Firm* — Ruggiero McAllister & McMahon LLC

(57) ABSTRACT

A cell structure of an insulated gate bipolar transistor (IGBT) with a control gate and a carrier storage layer, is provided including: an N-type drift layer with a first surface, an active region on a second surface opposing the first and an N-type storage layer, a P-type body layer and an N-type doped layer sequentially stacked in the active region from the first to the second surface, gate trench bodies, each of which extends from the second to the first surface in a first direction perpendicular to the first surface and contacts the N-type drift layer, and each of the at least three gate trench bodies is a gate trench or a control gate trench. A sidewall of the gate trench is in contact with the active region, and a sidewall of the control gate trench is in contact with the P-type layer but not with the N-type layer.

15 Claims, 8 Drawing Sheets

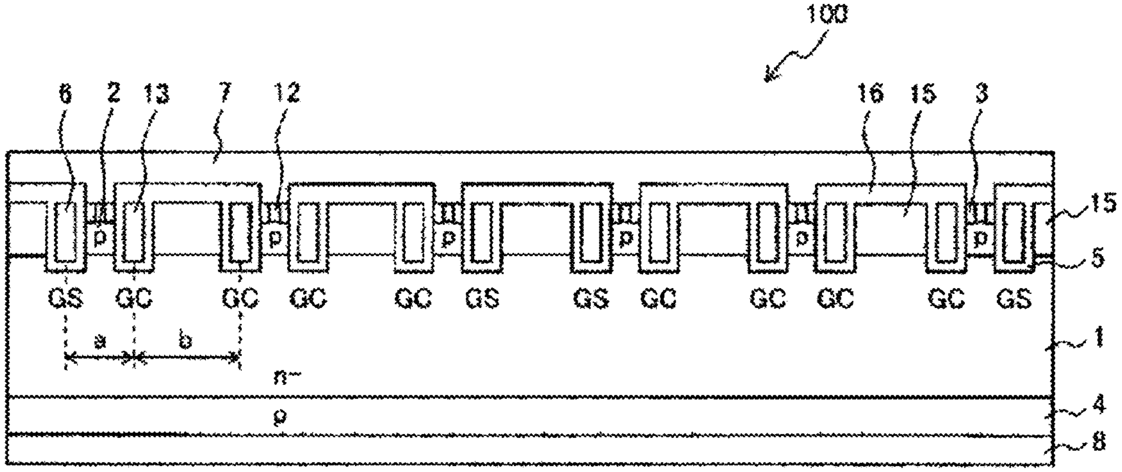
RELATED ART FIG. 1
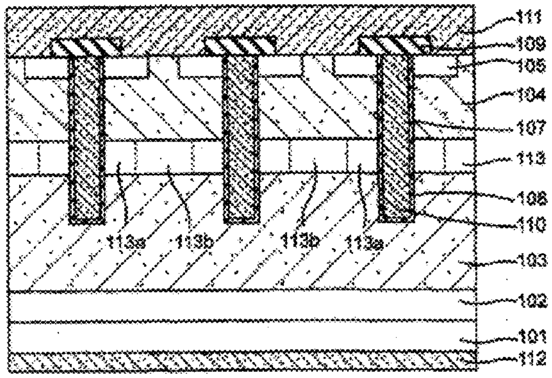
RELATED ART FIG. 2

CELL STRUCTURES OF INSULATED GATE BIPOLAR TRANSISTOR IGBT WITH A CONTROL GATE AND A CARRIER STORAGE LAYER, AND THEIR MANUFACTURING METHODS

CROSS-REFERENCE TO RELATED APPLICATIONS

This application claims the benefit under 35 U.S.C. § 119(a) of Chinese Application No. 202210909115.7 filed Jul. 29, 2022, the contents of which are incorporated by reference herein in their entirety.

BACKGROUND

1. Field of the Disclosure

The present disclosure relates to an insulated gate bipolar transistor IGBT with a control gate and a carrier storage layer. Specifically, the present disclosure relates to a cell structure of a mesa-type IGBT with a control gate and a carrier storage layer, and a manufacturing method thereof.

2. Description of the Related Art

An insulated gate bipolar transistor (IGBT) is a composite fully controlled voltage-driven power semiconductor device composed of a bipolar junction transistor (BJT) and an insulated gate metal oxide semiconductor field effect transistor (MOSFET). Wherein, BJT generally uses a giant transistor (GTR) that can operate under high voltage and high current, that is, a power transistor. IGTB combines the advantages of high input impedance of MOSFET and low on-state voltage drop of GTR, and is suitable for applications in an alternating current (AC) system with DC voltage of 600V or above, such as AC motor, frequency converter, switch power supply, lighting circuit, traction drive, and other fields.

The development trend of IGBT is to continuously optimize trade-off relationship between on-state voltage drop Vcesat, turn-off loss Eoff, reliability and cost under the premise of meeting market demands. For optimizing on-state voltage drop Vcesat and turn-off loss Eoff, a popular method is to reduce a total loss by introducing a carrier storage layer or a hole blocking layer. However, this method has limited effect on improving switch loss and switch frequency. FIG. 1 shows a cross-sectional view of an IGBT of the prior art, in which channel and source layers (that is, p-type well layer 2, n-type emitter layer 3, and p-type power supply layer 12) are implanted between sides of two kinds of gates GS and GC. The two kinds of gates GS and GC can each provide gate signals to control on and off states of a circuit. Since the semiconductor structure is not provided with a carrier storage layer, the turn-off time of the device will be prolonged.

FIG. 2 shows a cross-sectional view of another IGBT of the prior art, in which a carrier storage layer is arranged between two adjacent gate trenches, while the concentration of a carrier storage layer 113*a* near the sidewall of a gate trench is lower than the concentration of a carrier storage layer 113*b* distant from the gate trench. The purpose of such an arrangement is to optimize the uniformity of a threshold voltage Vth, and the semiconductor structure requires two photolithography processes to form the carrier storage layer. Since the width of the carrier storage layer in the semiconductor structure is equal to the distance between two adjacent trench gates, a minority carrier extraction channel could not be generated when the device is turned off, and the turn-off time of the device would be prolonged.

SUMMARY

The present disclosure discloses a cell structure of an insulated gate bipolar transistor (IGBT) with a control gate and a carrier storage layer, including: an N-type drift layer with a first surface, an active region located on a second surface opposing the first surface and including an N-type storage layer, a P-type body layer and an N-type doped layer sequentially stacked in the active region from the first surface to the second surface, and at least three gate trench bodies, each of the at least three gate trench bodies extending from the second surface to the first surface in a first direction perpendicular to the first surface and contacting the N-type drift layer, and each of the at least three gate trench bodies being a gate trench or a control gate trench. A sidewall of the gate trench is in contact with the active region, and a sidewall of the control gate trench is in contact with the P-type body layer but not in contact with the N-type storage layer.

As an embodiment of the present disclosure, the gate trench body includes a gate oxide layer located on a bottom surface and a sidewall of the gate trench body and a conductive material surrounded by the gate oxide layer to form a control gate or a gate, the bottom surface of the gate trench body is distant from the first surface and the second surface in the first direction, and the control gate trench corresponds to the control gate, and the gate trench corresponds to the gate.

As an embodiment of the present disclosure, the cell structure further includes: at least three dielectric layers with a third surface, the third surface is farther from the first surface and the bottom surface of the gate trench body than the second surface in the first direction, the at least three dielectric layers are spaced apart by two trenches, and a front metal layer is disposed on the at least three dielectric layers and in the two trenches.

As an embodiment of the present disclosure, signals of the gate and the control gate are respectively applied through the conductive material in the gate trench and the control gate trench, and the signal of the control gate is 0.5 us to 10 us ahead of the signal of the gate.

As an embodiment of the present disclosure, the front metal layer is arranged as an emitter, and when the IGBT is turned on, the gate and the control gate are at a higher potential than the emitter.

As an embodiment of the present disclosure, the sidewall of the control gate trench extends from the second surface to the first surface along the first direction perpendicular to the first surface and sequentially contacts the P-type body layer and the N-type drift layer, and the sidewall of the gate trench extends from the second surface to the first surface along the first direction perpendicular to the first surface and sequentially contacts the N-type doped layer, the P-type body layer, the N-type storage layer, and the N-type drift layer.

As an embodiment of the present disclosure, when the at least three gate trench bodies are three gate trench bodies, the three gate trench bodies include two gate trenches and one control gate trench, the two gate trenches and the one control gate trench are arranged in a manner of gate trench-control gate trench-gate trench along a second direction parallel to the first surface and perpendicular to the first direction, and are spaced apart by the P-type body layer, and a distance between adjacent sidewalls of one of the gate trenches and the one control gate trench minus a width of the N-type storage layer between the gate trench and the one control gate trench is in the range of 0.2 um to 1 um.

As an embodiment of the present disclosure, the distance between adjacent sidewalls of one of the gate trenches and the one control gate trench minus the width of the N-type storage layer between the gate trench and the one control gate trench is in the range of 0.2 um to 0.5 um.

As an embodiment of the present disclosure, when the at least three gate trench bodies are four gate trench bodies, the four gate trench bodies include two gate trenches and two control gate trenches, the two gate trenches and the two control gate trenches are arranged in a manner of gate trench-control gate trench-control gate trench-gate trench along a second direction parallel to the first surface and perpendicular to the first direction, and are spaced apart by the P-type body layer, or the two gate trenches and the two control gate trenches are arranged in a manner of gate trench-control gate trench-gate trench-control gate trench along the second direction parallel to the first surface and perpendicular to the first direction, and are spaced apart by the P-type body layer.

As an embodiment of the present disclosure, when a distance between the centerlines of two control gate trenches in the middle, or a control gate trench and a gate trench in the middle, of the four gate trench bodies, is greater than 4 um, an N-type storage layer is not arranged between the two control gate trenches in the middle or between the control gate trench and the gate trench in the middle.

As an embodiment of the present disclosure, when a distance between the centerlines of two control gate trenches in the middle, or a control gate trench and a gate trench in the middle, of the four gate trench bodies, is less than 3 um, an N-type storage layer is arranged between the two control gate trenches in the middle or between the control gate trench and the gate trench in the middle, and a width of the N-type storage layer is equal to the distance between the two control gate trenches in the middle or between the control gate trench and the gate trench in the middle.

As an embodiment of the present disclosure, the cell structure further includes: a back metal layer formed on another surface of the N-type drift layer distant from the first surface, and the back metal layer is configured as a collector.

As an embodiment of the present disclosure, the N-type storage layer is formed by ion implantation technology with an implantation energy between 1.5 MeV and 4 MeV.

As an embodiment of the present disclosure, the implantation energy is between 2 MeV and 3.5 MeV.

The present disclosure also discloses a method for manufacturing a cell structure of an insulated gate bipolar transistor (IGBT) with a control gate and a carrier storage layer, including the steps of: forming an N-type drift layer with a first surface, forming an active region on the first surface of the N-type drift layer, the active region being located on a second surface opposing the first surface and including an N-type storage layer, a P-type body layer and an N-type doped layer, which are sequentially formed from the first surface to the second surface, forming at least three gate trench bodies from the second surface to the first surface along a first direction perpendicular to the first surface, each of the at least three gate trench bodies extending and contacting the N-type drift layer, and each of the at least three gate trench bodies being a gate trench or a control gate trench. A sidewall of the gate trench is in contact with the active region, and a sidewall of the control gate trench is in contact with the P-type body layer but not in contact with the N-type storage layer.

As an embodiment of the present disclosure, the method further includes the steps of: forming a gate oxide layer on a bottom surface and a sidewall of the gate trench body to form a control gate or a gate, the bottom surface of the gate trench body being distant from the first surface and the second surface in the first direction, and filling the gate trench body, on which the gate oxide layer is formed, with a conductive material, and the control gate trench corresponds to the control gate, and the gate trench corresponds to the gate.

As an embodiment of the present disclosure, a dielectric layer with a third surface is formed, the third surface is farther from the first surface and the bottom surface of the gate trench body than the second surface in the first direction, the dielectric layer is formed from the second surface to the third surface, the dielectric layer is etched from the third surface to the second surface along the first direction perpendicular to the first surface to form two trenches which split the dielectric layer, each of the two trenches is etched into the P-type body layer, and a front metal layer is formed on the split dielectric layer and in the two trenches.

As an embodiment of the present disclosure, signals of the gate and the control gate are respectively applied through the conductive material in the gate trench, and the signal of the additional control gate is 0.5 us to 10 us ahead of the signal of the gate electrode.

As an embodiment of the present disclosure, the front metal layer is formed as an emitter, and when the IGBT is turned on, the gate and the control gate are at a higher potential than the emitter.

As an embodiment of the present disclosure, the sidewall of the control gate trench extends from the second surface to the first surface along the first direction perpendicular to the first surface and sequentially contacts the P-type body layer and the N-type drift layer, and the sidewall of the gate trench extends from the second surface to the first surface along the first direction perpendicular to the first surface and sequentially contacts the N-type doped layer, the P-type body layer, the N-type storage layer, and the N-type drift layer.

As an embodiment of the present disclosure, when the at least three gate trench bodies are three gate trench bodies, the three gate trench bodies include two gate trenches and one control gate trench, the two gate trenches and the one control gate trench are arranged in a manner of gate trench-control gate trench-gate trench along a second direction parallel to the first surface and perpendicular to the first direction, and are spaced apart by the P-type body layer, and a distance between adjacent sidewalls of one of the gate trenches and the one control gate trench minus a width of the N-type storage layer between the gate trench and the one control gate trench is in the range of 0.2 um to 1 um.

As an embodiment of the present disclosure, the distance between adjacent sidewalls of one of the gate trenches and the one control gate trench minus the width of the N-type storage layer between the gate trench and the one control gate trench is in the range of 0.2 um to 0.5 um.

As an embodiment of the present disclosure, when the at least three gate trench bodies are four gate trench bodies, the four gate trench bodies include two gate trenches and two control gate trenches, the two gate trenches and the two control gate trenches are arranged in a manner of gate trench-control gate trench-control gate trench-gate trench along a second direction parallel to the first surface and perpendicular to the first direction, and are spaced apart by the P-type body layer, or the two gate trenches and the two control gate trenches are arranged in a manner of gate trench-control gate trench-gate trench-control gate trench along the second direction parallel to the first surface and perpendicular to the first direction, and are spaced apart by the P-type body layer.

As an embodiment of the present disclosure, when a distance between centerlines of two control gate trenches in the middle, or a control gate trench and a gate trench in the middle, of the four gate trench bodies is greater than 4 um, an N-type storage layer is not arranged between the two control gate trenches in the middle or between the control gate trench and the gate trench in the middle.

As an embodiment of the present disclosure, when a distance between centerlines of two control gate trenches in the middle, or a control gate trench and a gate trench in the middle, of the four gate trench bodies is less than 3 um, an N-type storage layer is arranged between the two control gate trenches in the middle or between the control gate trench and the gate trench in the middle, and a width of the N-type storage layer is equal to the distance between the two control gate trenches in the middle or between the control gate trench and the gate trench in the middle.

As an embodiment of the present disclosure, etching each of the two trenches into the P-type body layer includes: etching each of the two trenches into the P-type body layer to the same depth as the N-type doped region.

As an embodiment of the present disclosure, the N-type storage layer is formed by ion implantation technology with an implantation energy between 1.5 MeV and 4 MeV.

As an embodiment of the present disclosure, the implantation energy is between 2 MeV and 3.5 MeV.

As an embodiment of the present disclosure, the method further includes: forming a back metal layer on another surface of the N-type drift layer distant from the first surface, and forming the back metal layer as a collector.

The present disclosure also claims an IGBT with a control gate and a carrier storage layer, including at least one cell structure as described above.

BRIEF DESCRIPTION OF THE DRAWINGS

FIG. 1 shows a schematic diagram of a cross-section of an IGBT of the prior art.

FIG. 2 shows a schematic diagram of a cross-section of another IGBT of the prior art.

DETAILED DESCRIPTION

In order to enable a person skilled in the art to better understand the technical solutions of the present disclosure, the cell structure of IGBT with a control gate and a carrier storage layer, and the manufacturing method thereof provided in the present disclosure will be described in further detail with reference to the accompanying drawings.

It should also be noted that for the purposes of describing these exemplary embodiments herein, the drawings illustrate general features of the method and device of the exemplary embodiments of the disclosure. These drawings, however, are not to scale and may not precisely reflect the features of any given embodiment, and should not be interpreted as defining or limiting the numerical ranges or characteristics of the exemplary embodiments within the scope of the present disclosure.

The terms “with”, “including”, “comprising”, “containing”, and the like, are open-ended and indicate the presence of a stated structure, element, or feature, but do not preclude the presence of additional elements or features. The articles “a,” “an,” or “the” are intended to encompass the plural as well as the singular meanings, unless the context clearly indicates otherwise.

The present disclosure proposes a new IGBT structure, which has lower turn-off loss and shorter turn-on delay Tdon/turn-off delay Tdoff, and an on-state voltage drop Vcesat comparable to that of a conventional carrier storage layer structure. The following embodiments are provided to help a person skilled in the art better understand the technical solutions of the present disclosure.

Figure 3A:
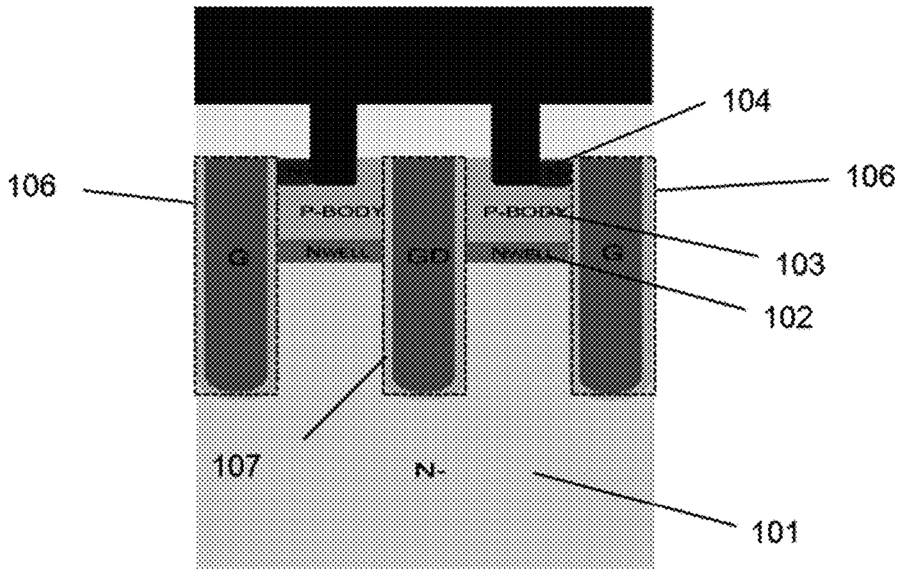
FIG. 3A shows a cell structure of an IGBT with a control gate and a carrier storage layer in the prior art.

FIG. 3A shows a cell structure of an IGBT with a control gate and a carrier storage layer in the prior art, which includes: an N-type drift layer 101, an N-type storage layer 102, a P-type body layer 103, an N-type doped layer 104, and three gate trench bodies. The gate trench bodies on both sides are gate trenches 106, and the intermediate gate trench body is a gate trench 107 shorted to an emitter. As shown in FIG. 3A, the width of the N-type storage layer 102 is equal to the distance between sidewalls of two adjacent gate trench bodies.

Figure 3B:
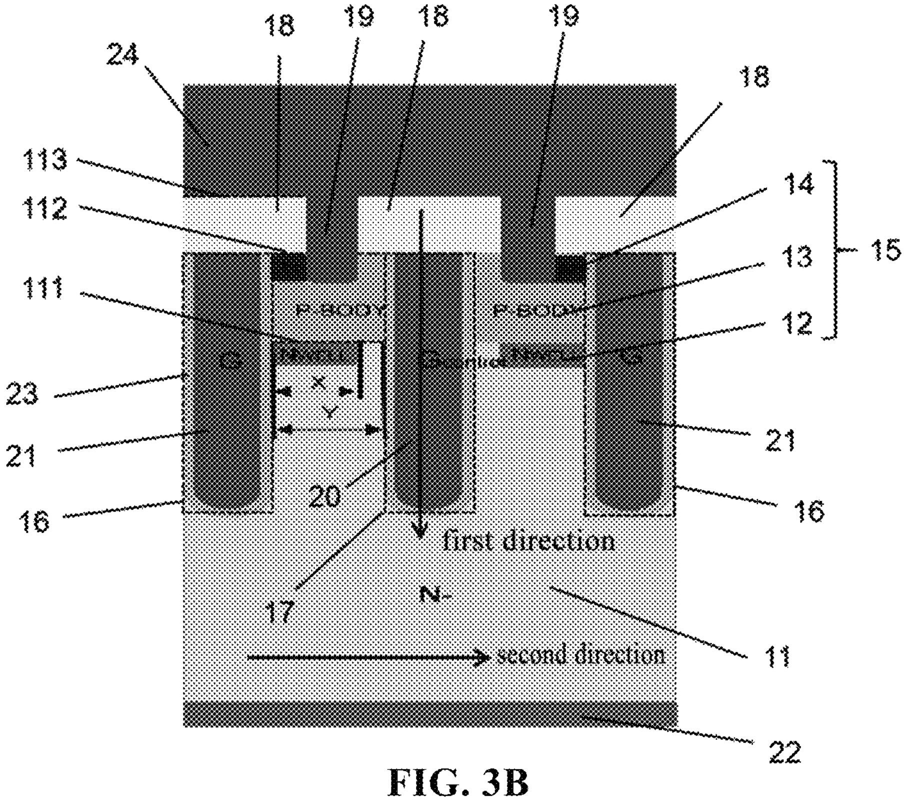
FIG. 3B shows a cell structure of an IGBT with a control gate and a carrier storage layer of the present disclosure.

FIG. 3B shows a cell structure of an IGBT with a control gate and a carrier storage layer of the present disclosure, which includes: an N-type drift layer 11 with a first surface 111 and an active region 15. The active region 15 is located on a second surface 112 opposing the first surface 111. The active region 15 includes an N-type storage layer 12, a P-type body layer 13 and an N-type doped layer 14. The N-type storage layer 12, the P-type body layer 13 and the N-type doped layer 14 are sequentially stacked in the active region 15 from the first surface 111 to the second surface 112. The cell structure further includes at least three gate trench bodies, each of the at least three gate trench bodies extends from the second surface 112 to the first surface 111 in a first direction perpendicular to the first surface 111 and contacts the N-type drift layer 11, and each of the at least three gate trench bodies is a gate trench 16 or a control gate trench 17. A sidewall of the gate trench 16 is in contact with the active region, and a sidewall of the control gate trench 17 is in contact with the P-type body layer 13 but not in contact with the N-type storage layer 12. Further, the sidewall of the control gate trench 17 is also not in contact with the N-type doped layer 14.

In an embodiment of the present disclosure, the function of the active region 15 is to provide a channel to realize conductive function of a semiconductor. The active region 15 of the present disclosure needs to include an N-type storage layer 12, a P-type body layer 13, and an N-type doped layer 14, and the P-type body layer 13 alone cannot serve as the active region 15. As shown in FIG. 3B, the active region 15 of the present disclosure is only in contact with the sidewall of the gate trench 16, and not in contact with the sidewall of the control gate trench 17, and the sidewall of the control gate trench 17 is only in contact with the P-type body layer 13. Therefore, when a voltage is applied to a gate, a conductive channel may be formed. Since the sidewall of the control gate trench 17 is not in contact with the N-type doped layer 14, a conductive channel cannot be formed when a voltage is applied to an additional control gate. Therefore, the additional control gate of the present disclosure only serves to provide an auxiliary control signal to change the carrier storage effect in on-state and the extraction rate of minority carriers in off-state, since there is no channel formed on both sides of the control gate trench 17.

Compared with FIG. 3A, the structure shown in FIG. 3B has a lower Eoff value and shorter turn-on and turn-off delay times Tdon/Tdoff with the on-state voltage drop Vcesat being comparable.

In the present disclosure, the first surface is an upper surface of the N-type drift layer 11 of the semiconductor substrate, and the second surface is an upper surface of the P-type body layer 13 in proximity to the sidewall of the control gate trench 17. As shown in FIG. 3B, since the N-type doped layer 14 is stacked on the P-type body layer 13 near the sidewall of the gate trench 16, the second surface may also be an upper surface of the N-type doped layer 14.

The first direction in the present disclosure is a direction perpendicular to the upper surface of the N-type drift layer 11 and extending to the lower surface of the N-type drift layer 11. As in the prior art shown in FIG. 3A, the at least three gate trench bodies vertically extend into the N-type drift layer 11 and do not penetrate through the N-type drift layer 11.

In an embodiment of the present disclosure, as in the prior art shown in FIG. 3A, the gate trench body includes a gate oxide layer 23 located on a bottom surface and a sidewall of the gate trench body, and a conductive material surrounded by the gate oxide layer 23 to form a control gate 20 and a gate 21. The bottom surface of the gate trench body is distant from the first surface 111 and the second surface 112 in the first direction, and the control gate trench 17 corresponds to the control gate 20, while the gate trench 16 corresponds to the gate 21. Specifically, the gate oxide layer 23 on the bottom surface and the sidewall of the gate trench body has an insulating function. The conductive material surrounded by the gate oxide layer 23 may be polysilicon, and the gate trench body is completely filled with polysilicon. Polysilicon metal is used to form the gate or the control gate in the cell structure.

In an embodiment of the present disclosure, the cell structure further includes: at least three dielectric layers 18 with a third surface 113, the third surface 113 is farther from the first surface 111 and the bottom surface of the gate trench body than the second surface 112 in the first direction. The at least three dielectric layers 18 are spaced apart by two trenches 19, and a front metal layer 24 is disposed on the at least three dielectric layers 18 and in the two trenches 19.

In an embodiment of the present disclosure, signals of the gate and the control gate are respectively applied through the conductive materials in the gate trench 16 and the control gate trench 17, and the signal of the control gate 20 is 0.5 us to 10 us ahead of the signal of the gate 21. In an embodiment of the present disclosure, the front metal layer 24 is configured as an emitter. In an actual application circuit, magnitudes of the signal of the gate and the signal of the control gate are measured relative to that of the emitter. Regardless whether it is in on-state or resistive state, the emitter is always grounded, that is, the potential of the emitter is zero. When the device is on, the potentials of the gate and the control gate are higher than the potential of the emitter (for example, may be 15V), and when the device is turned off, the potentials of the gate and the control gate are lower than the potential of the emitter (for example, may be −15V). In this way, in the on-state or turn-on process, the control gate 20 acts as an auxiliary structure, which could enhance carrier storage capacity. During the turn-off process, since the control gate 20 is turned off in advance, carriers could be accelerated through a minority carrier extraction channel to complete carrier extraction process.

In an embodiment of the present disclosure, the sidewall of the control gate trench 17 extends from the second surface 112 to the first surface 111 along the first direction perpendicular to the first surface 111, and sequentially contacts the P-type body layer 13 and the N-type drift layer 11, and the sidewall 16 of the gate trench 16 extends from the second surface 112 to the first surface 111 along the first direction perpendicular to the first surface 111, and sequentially contacts the N-type doped layer 14, the P-type body layer 13, the N-type storage layer 12, and the N-type drift layer 11. As shown in FIG. 3B, the sidewall of the gate trench 16 is in contact with the active region and the N-type drift layer 11, and the sidewall of the control gate trench 17 is in contact with the P-type body layer 13 and the N-type drift layer 11, but not in contact with the N-type storage layer 12. Further, the sidewall of the control gate trench 17 is also not in contact with the N-type doped layer 14.

In an embodiment of the present disclosure, as shown in FIG. 3B, when the at least three gate trench bodies are three gate trench bodies, the three gate trench bodies include two gate trenches 16 and one control gate trench 17, and the two gate trenches 16 and the one control gate trench 17 are arranged in a manner of gate trench 16—control gate trench 17—gate trench 16 along a second direction parallel to the first surface and perpendicular to the first direction, and are spaced apart by the P-type body layer 13. The distance Y between adjacent sidewalls of one of the gate trenches 16 and the one control gate trench 17 minus the width X of the N-type storage layer 12 between the gate trench and the one control gate trench, that is, the value of (Y-X) is in the range of 0.2 um to 1 um. As an embodiment of the present disclosure, the value of (Y-X) could be in the range of 0.2 um to 0.5 um. Since the N-type storage layer 12 partially covers the region between the sidewalls of adjacent gate trenches, there is a minority carrier extraction channel when the device is turned off, which could shorten the turn-off time of the device.

In an embodiment of the present disclosure, the N-type storage layer 12 is formed by ion implantation technology, with an implantation energy between 2 MeV and 3.5 MeV. As some embodiments of the present disclosure, the implantation energy may be between 1.5 MeV and 4 MeV, and the implantation dose may be between 1E12 and 2E13. Phosphorus implantation may be adopted to form the N-type storage layer. Ion implantation process is a dominant doping technology in IC manufacturing, which achieves doping by ionizing impurities, and accelerating ionized impurities by an electric field to directly inject them into a silicon wafer.

Figure 4:
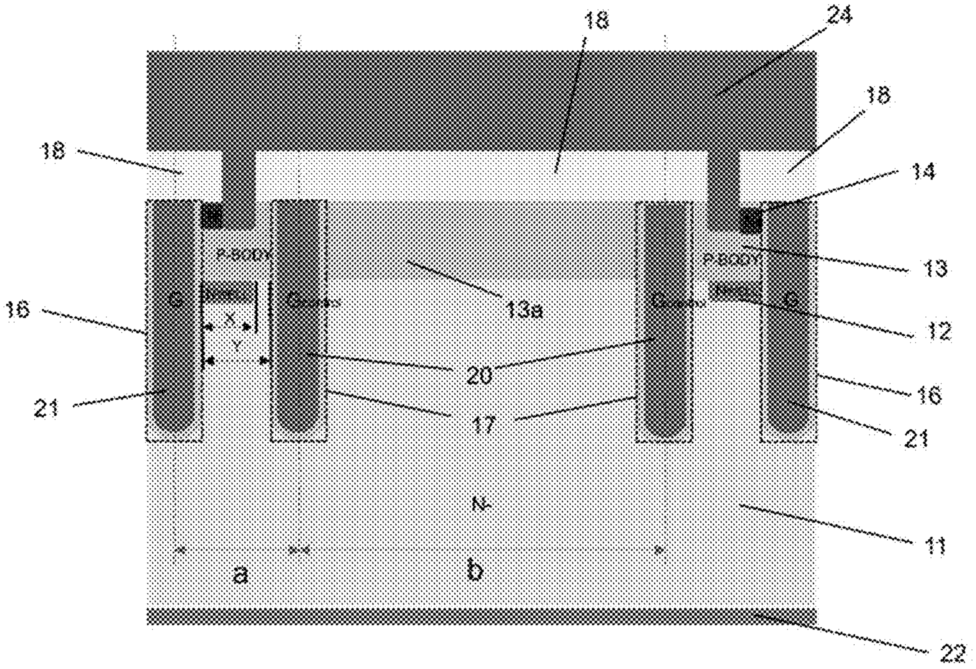
FIG. 4 shows a schematic diagram of a cross-section of an IGBT according to an embodiment of the present disclosure.

In another embodiment of the present disclosure, as shown in FIG. 4, when the at least three gate trench bodies are four gate trench bodies, the four gate trench bodies include two gate trenches 16 and two control gate trenches 17, and the two gate trenches 16 and the two control gate trenches 17 are arranged in a manner of gate trench 16—control gate trench 17—control gate trench 17—gate trench 16 along a second direction parallel to the first surface and perpendicular to the first direction, and are spaced apart by the P-type body layer. The P-type body layer here includes: the P-type body layer 13 in the active region and a second P-type body layer 13*a*. As shown in FIG. 4, the two control gate trenches 17 in the middle are spaced apart by the second P-type body layer 13*a*, and the second P-type body layer 13*a* is not the P-type body layer 13 in the above active region. The second P-type body layer 13*a* is made of the same material as the P-type body layer 13 in the active region. When the distance b between the centerlines of two control gate trenches 17 in the middle of the four gate trench bodies is greater than 4 um, a second N-type storage layer 12*a* is not arranged between the sidewalls of the two control gate trenches 17 in the middle. It should be noted that, the distance Y between adjacent sidewalls of the gate trench 16 and the control gate trench 17 that are adjacent on the sides of the four gate trench bodies, minus the width X of the N-type storage layer 12 between the gate trench and the control gate trench, that is, the value of (Y-X) is in the range of 0.2 um to 1 um. As an embodiment of the present disclosure, the value of (Y-X) could be in the range of 0.2 um to 0.5 um.

Figure 5:
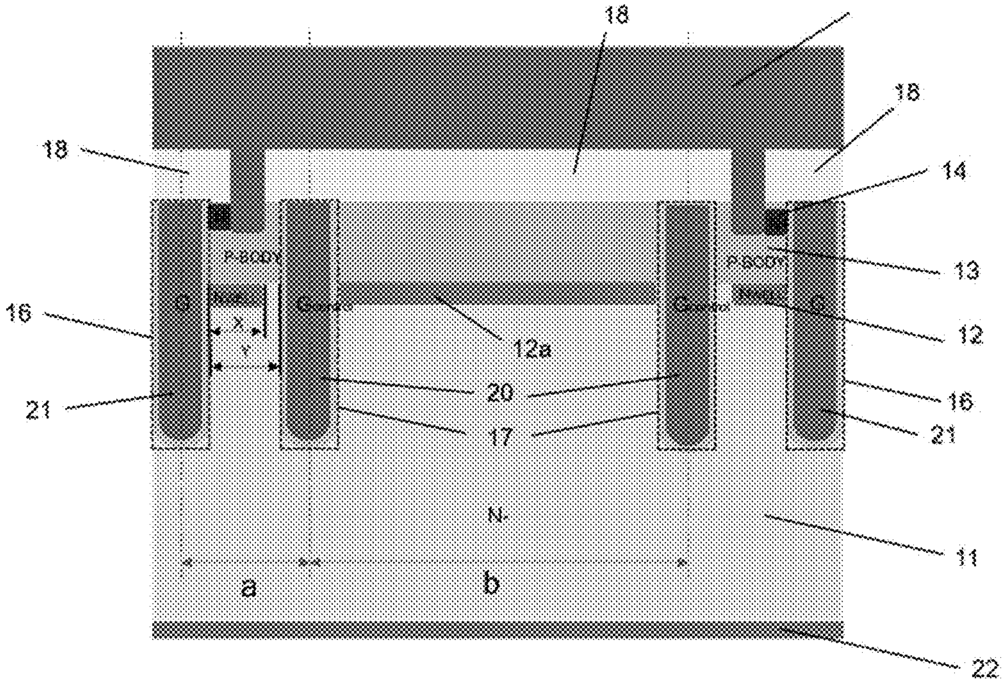
FIG. 5 shows a schematic diagram of a cross-section of an IGBT according to an embodiment of the present disclosure.

In another embodiment of the present disclosure, as shown in FIG. 5, when the distance b between the centerlines of two control gate trenches 17 in the middle of the four gate trench bodies is less than 3 um, a second N-type storage layer 12*a* is arranged between the sidewalls of the two control gate trenches 17 in the middle. As shown in FIG. 5, the second N-type storage layer 12*a* is not the N-type storage layer 12 in the above active region, the implantation material of the second N-type storage layer 12*a* is the same as the implantation material of the N-type storage layer 12 in the above active region, and the width of the second N-type storage layer 12*a* is equal to the distance between the sidewalls of the two control gate trenches 17 in the middle. By arranging the second N-type storage layer 12*a*, conductance modulation effect of the region between the sidewalls of the two control gate trenches 17 in the middle could be improved.

Figure 6:
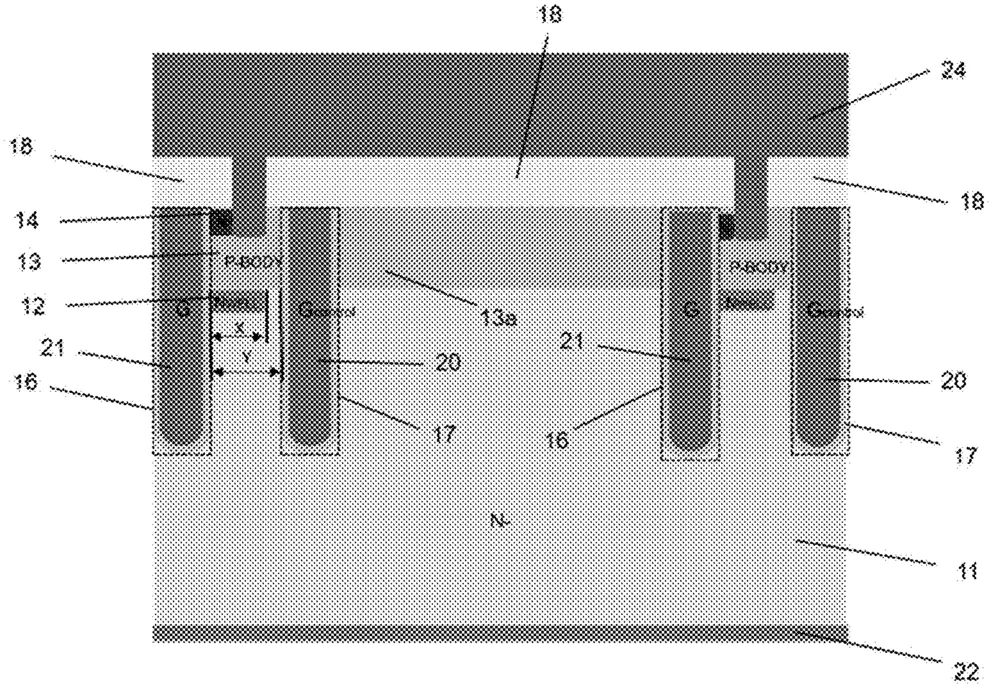
FIG. 6 shows a schematic diagram of a cross-section of an IGBT according to another embodiment of the present disclosure.

In another embodiment of the present disclosure, as shown in FIG. 6, the two gate trenches 16 and the two control gate trenches 17 are arranged in a manner of gate trench 16—control gate trench 17—gate trench 16—control gate trench 17 along a second direction parallel to the first surface and perpendicular to the first direction, and are spaced apart by the P-type body layer. The P-type body layer here includes: the P-type body layer 13 in the active region and a second P-type body layer 13*a*. As shown in FIG. 6, the control gate trench 17 and the gate trench 16 in the middle are spaced apart by the second P-type body layer 13*a*, and the second P-type body layer 13*a* is not the P-type body layer 13 in the above active region. The second P-type body layer 13*a* is made of the same material as the P-type body layer 13 in the active region. When the distance b between the centerlines of the control gate trench 17 and the gate trench 16 in the middle of the four gate trench bodies is greater than 4 um, a second N-type storage layer 12*a* is not arranged between the sidewalls of the control gate trench 17 and the gate trench 16 in the middle. It should be noted that, the distance Y between adjacent sidewalls of the gate trench 16 and the control gate trench 17 that are adjacent on the sides of the four gate trench bodies minus the width X of the N-type storage layer 12 between the gate trench and the control gate trench, that is, the value of (Y-X) is in the range of 0.2 um to 1 um. As an embodiment of the present disclosure, the value of (Y-X) could be in the range of 0.2 um to 0.5 um.

Figure 7:
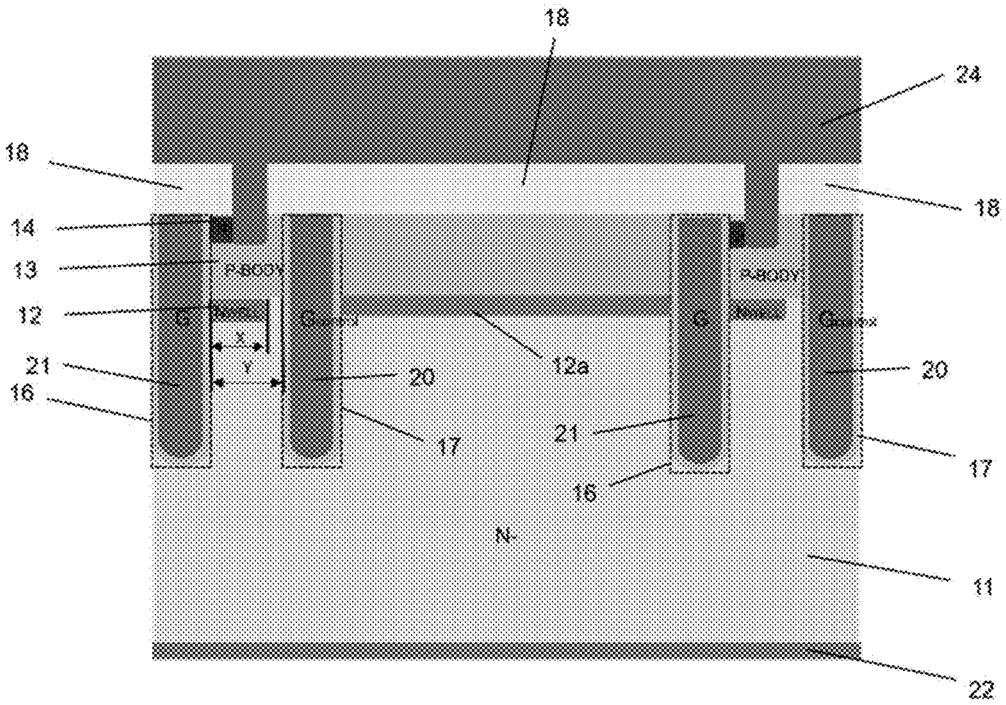
FIG. 7 shows a schematic diagram of a cross-section of an IGBT according to another embodiment of the present disclosure.

In another embodiment of the present disclosure, as shown in FIG. 7, when the distance b between the centerlines of the control gate trench 17 and the control gate trench 17 in the middle of the four gate trench bodies is less than 3 um, a second N-type storage layer 12*a* is arranged between the sidewalls of the control gate trench 17 and the gate trench 16 in the middle. As shown in FIG. 7, the second N-type storage layer 12*a* is not the N-type storage layer 12 in the above active region. The implantation material of the second N-type storage layer 12*a* is the same as the implantation material of the N-type storage layer 12 in the above active region, and the width of the second N-type storage layer 12*a* is equal to the distance between the sidewalls of the control gate trench 17 and the gate trench 16 in the middle. By arranging the second N-type storage layer 12*a*, conductance modulation effect of the region between the sidewalls of the control gate trench 17 and the gate trench 16 in the middle could be improved.

In the cell structure shown in FIG. 4 to FIG. 7, the functions of the gate 21 and the control gate 20 are the same as those of a basic cell structure (e.g., as shown in FIG. 3B).

The cell structure of IGBT of the present disclosure further includes a back metal layer 22 formed on another surface of the N-type drift layer distant from the first surface, and the back metal layer 22 is arranged as a collector. That is, a back metal layer 22 is formed on the lower surface of the N-type drift layer 11.

Preferably, the carrier storage layer (e.g., N-type storage layer) of the present disclosure has only one doping concentration, and the carrier storage layer does not completely cover the area between the sidewalls of the trenches. Since the carrier storage layer partially covers the area between the sidewalls of the trenches, there is a minority carrier extraction channel when the device is turned off, which could shorten the turn-off time of the device. To maintain the same or better conductance modulation effect as a conventional common injection carrier storage layer, the present disclosure also introduces a control gate 20. The control gate 20 is beneficial for forming an N-type storage layer (completing the N-type storage layer that is not covered) so as to better form a carrier injection enhancement effect layer. The signal of the control gate 20 is 0.5 us to 10 us ahead of the signal of the gate 21. Therefore, in the on-state or turn-on process, the control gate 20 acts as an auxiliary structure, which has the effect of enhancing carrier storage capacity. During the turn-off process, since the control gate 20 is turned off in advance, the carriers may be accelerated through a minority carrier extraction channel to complete the carrier extraction process.

The present disclosure further provides a method for manufacturing a cell structure of an IGBT with a control gate and a carrier storage layer, including the steps as follows: forming an N-type drift layer 11 with a first surface, forming an active region on the first surface of the N-type drift layer 11, the active region being located on a second surface opposing the first surface and including an N-type storage layer 12, a P-type body layer 13 and an N-type doped layer 14, which are sequentially formed from the first surface to the second surface, forming at least three gate trench bodies from the second surface to the first surface along a first direction perpendicular to the first surface. Each of the at least three gate trench bodies extends to and contacts the N-type drift layer 11, and each of the at least three gate trench bodies is a gate trench 16 or a control gate trench 17. A sidewall of the gate trench 16 is in contact with the active region, a sidewall of the control gate trench 17 is in contact with the P-type body layer 13 but not in contact with the N-type storage layer 12. Further, the sidewall of the control gate trench 17 is also not in contact with the N-type doped layer 14.

In an embodiment of the present disclosure, the method further includes: forming a gate oxide layer on the bottom surface and sidewall of the gate trench body to form a control gate or a gate, the bottom surface of the gate trench body being distant from the first surface and the second surface in the first direction, and filling the gate trench body, where the gate oxide layer is formed, with a conductive material. The control gate trench corresponds to the control gate, and the gate trench corresponds to the gate.

In an embodiment of the present disclosure, the method further includes: forming a dielectric layer 18 with a third surface, the third surface being farther from the first surface and the bottom surface of the gate trench body than the second surface in the first direction, and the dielectric layer 18 being formed from the second surface to the third surface, etching the dielectric layer 18 along the first direction perpendicular to the first surface from the third surface to the second surface to form two trenches 19 that split the dielectric layer 18, etching each of the two trenches 19 into the P-type body layer 13, and forming a front metal layer 24 on the split dielectric layer 18 and in the two trenches 19.

Figure 8:
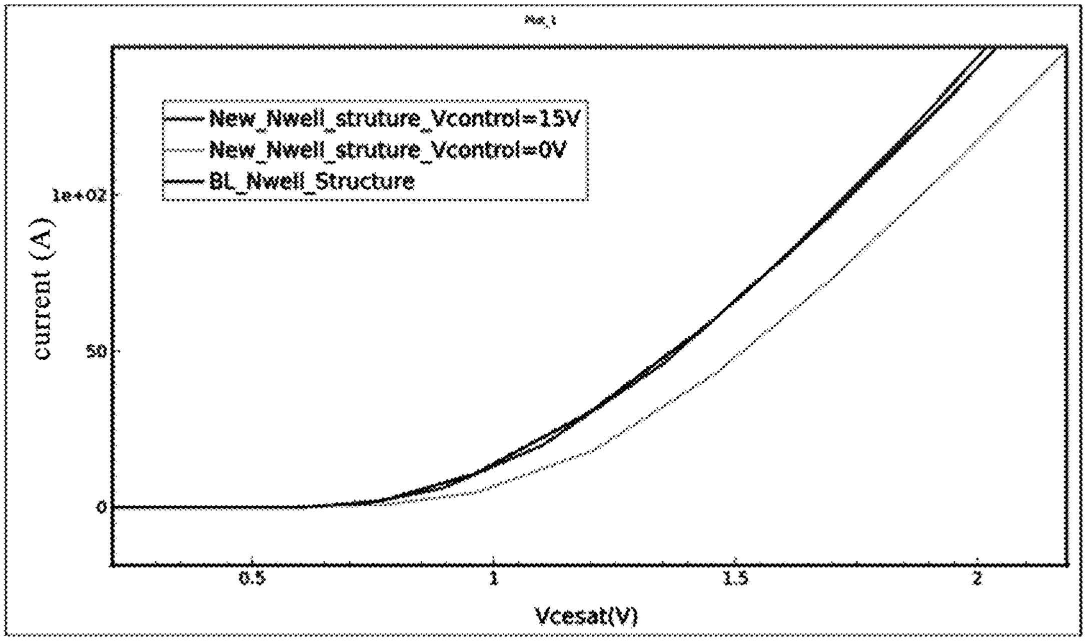
FIG. 8 shows comparison of the on-state voltage drop Vcesat between an existing structure of FIG. 3A and a new structure of FIG. 3B of the present disclosure.

In order to verify the improvement of the present disclosure, FIGS. 8-13 show simulation comparison diagrams of an existing structure of FIG. 3A and a new structure of FIG. 3B of the present disclosure. For high energy ion implantation, the range of lateral distribution of phosphorus element with energy of 2.5 MeV calculated by SRIM is about 0.2 um, The value of (Y-X) already includes this deviation. FIG. 8 shows a comparison of the on-state voltage drop Vcesat between the existing structure of FIG. 3A and the new structure of FIG. 3B of the present disclosure. The signal of the additional control gate (New_Nwell_struture_Vcontrol) of the new structure of the present disclosure includes 0V and 15V. As can be seen from FIG. 8, during the on state, when the signal of the control gate is 15V, Vcesat of the new structure of the present disclosure is substantially the same as that of the existing structure. When the signal of the control gate is 0V, the Vcesat of the new structure of the present disclosure is higher than that of the existing structure. Therefore, when the device is turned on, the signal of the control gate is ahead of the signal of the gate to keep the on-state characteristics of the device unchanged. When the device is turned off, the signal of the control gate is turned off earlier than the signal of the gate to enhance extraction rate of holes and reduce turn-off loss.

Figure 9:
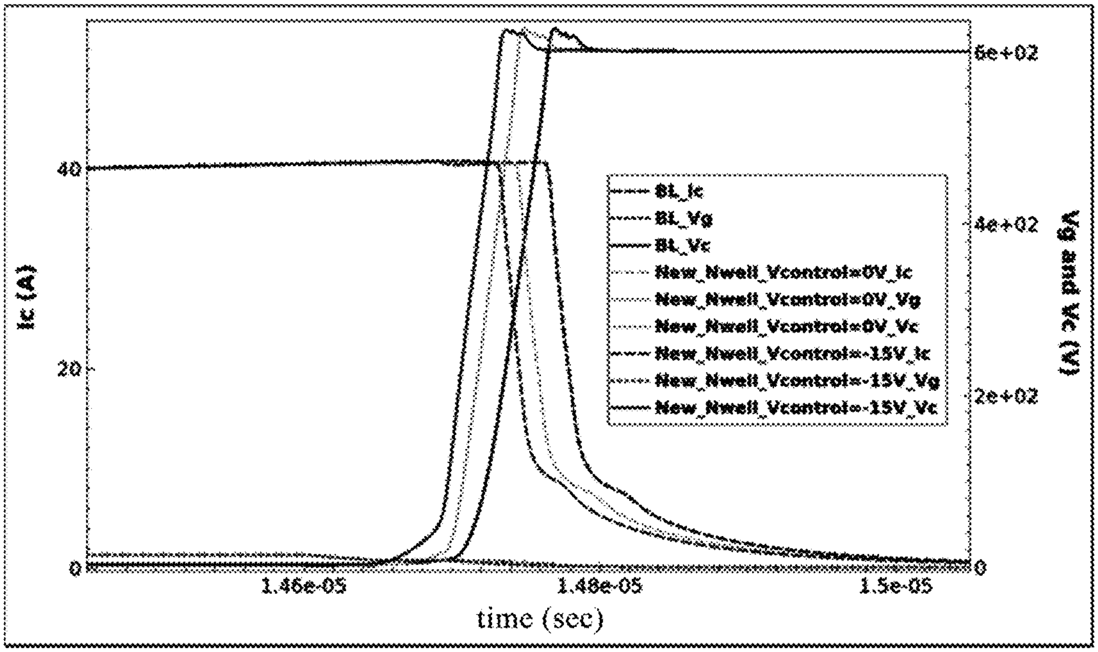
FIG. 9 shows comparison of turn-off waveform between the existing structure of FIG. 3A and the new structure of FIG. 3B of the present disclosure.

FIG. 9 shows comparison of turn-off waveforms between the existing structure of FIG. 3A and the new structure of FIG. 3B of the present disclosure. The signal of the additional control gate (New_Nwell_struture_Vcontrol) of the new structure includes 0V and −15V. In a comparison diagram of turn-off curves of the device of FIG. 9, as an example, the leftmost line of three lines represents the turn-off waveform at the moment when the device is turned off in the case that the signal of the additional control gate is −15V, and includes: −15V_Ic, −15V_Vg and −15V_Vc. As an example, the middle line of the three lines corresponds to the turn-off waveform when the signal of the additional control gate is 0V, and includes: 0V_Ic, 0V_Vg and 0V_Vc. As an example, the rightmost line of the three lines corresponds to the turn-off waveform in the prior art, and includes: BL_Ic, BL_Vg and BL_Vc. As can be seen from FIG. 9, when the signal of the additional control gate of the new structure of the present disclosure is 0V (for example, the turn-off waveform shown by the middle line of the three lines), due to the presence of an additional hole extraction channel, it may be turned off earlier compared with the prior art (e.g., the turn-off waveform shown by the rightmost line of the three lines). By adding a signal of an additional control gate (e.g., −Vg=−15V), the turn-off time of the device may be further shortened (e.g., the turn-off waveform shown by the leftmost line of the three lines).

Figure 10:
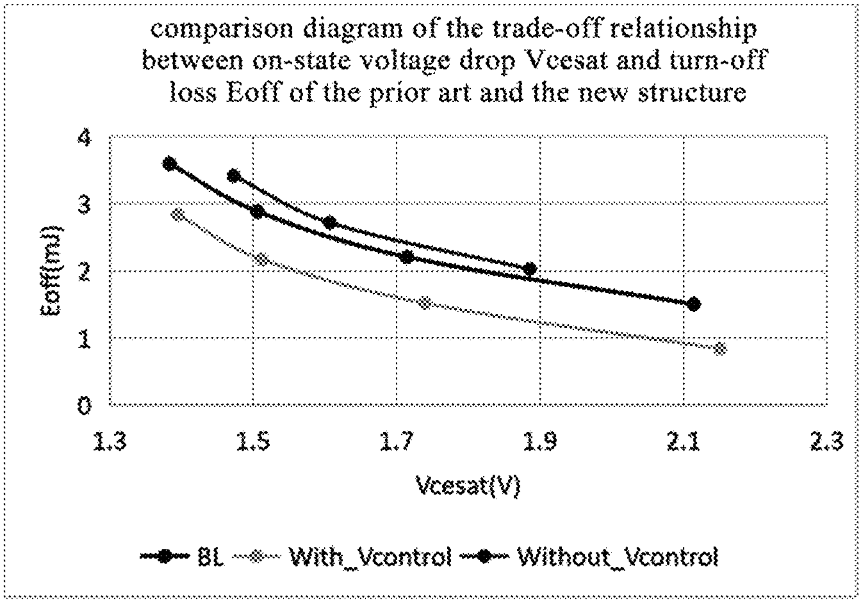
FIG. 10 shows a comparison diagram of the trade-off relationship between the on-state voltage drop Vcesat and the turn-off loss Eoff of the existing structure of FIG. 3A and the new structure of FIG. 3B of the present disclosure.

FIG. 10 shows a comparison diagram of the trade-off relationship between the on-state voltage drop Vcesat and the turn-off loss Eoff of the existing structure of FIG. 3A and the new structure of FIG. 3B of the present disclosure. Referring to the above explanation of FIGS. 8 and 9, if the new structure does not have a signal of the additional control gate (for example, the control gate is grounded), as the top curve of FIG. 10 shows, its Vcesat is higher than that of the existing structure, and its turn-off loss (e.g., turn-off time) is greater than that of the existing structure. When a signal of the additional control gate is added, as the bottom curve of FIG. 10 shows, its Vcesat is comparable to that of the prior art, and its turn-off loss (e.g., turn-off time) is further reduced/shortened. As can be seen from FIG. 10, the trade-off relationship between Vcesat and Eoff after adding an additional control gate (Vcontrol) is better than that of the prior art.

Figure 11:
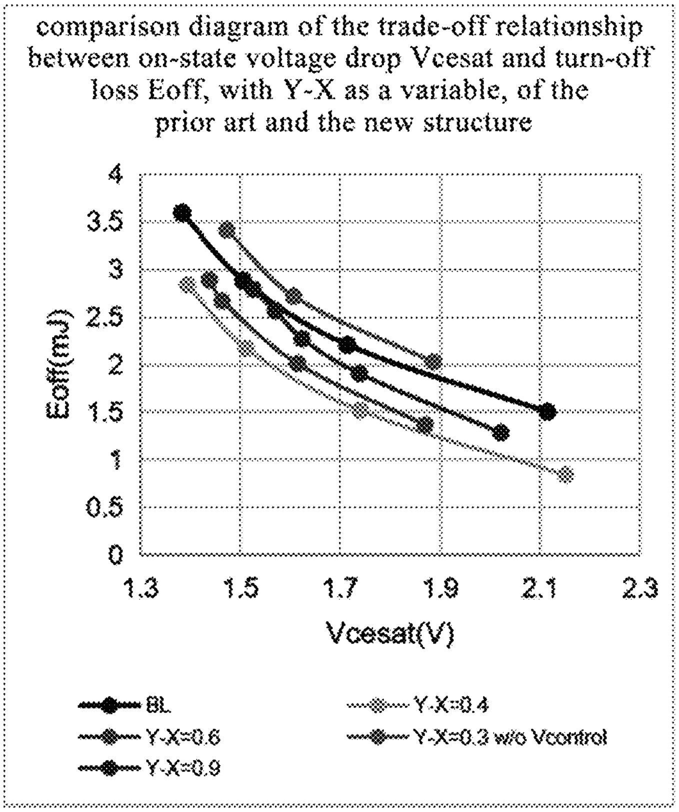
FIG. 11 shows the trade-off relationship between the on-state voltage drop Vcesat and the turn-off loss Eoff, with Y-X as a variable, of the existing structure of FIG. 3A and the new structure of FIG. 3B of the present disclosure.

FIG. 11 shows the trade-off relationship between the on-state voltage drop Vcesat and the turn-off loss Eoff with (Y-X) as a variable of the existing structure of FIG. 3A and the new structure of FIG. 3B of the present disclosure. As can be seen from FIG. 11, in the existing structure without an additional control gate, the trade-off relationship between Vcesat and Eoff in the case that the value of (Y-X) is 0.3 is not as good as the trade-off relationship between Vcesat and Eoff in the case that the value of (Y-X) is 0.9 in the structure of the present disclosure with an additional control gate. In other words, if no additional control gate is added, even if (Y-X) is very small (for example, the value of (Y-X) is 0.3), the trade-off relationship between Vcesat and Eoff is worse than that of the prior art, but after adding an additional control gate, even if the value of (Y-X) is increased to 0.9 um, the trade-off relationship between Vcesat and Eoff of the new structure of the present disclosure is still better than that of the prior art. In the case where the present disclosure has an additional control gate, the smaller the value of (Y-X), the better the trade-off relationship between Vcesat and Eoff.

Figure 12:
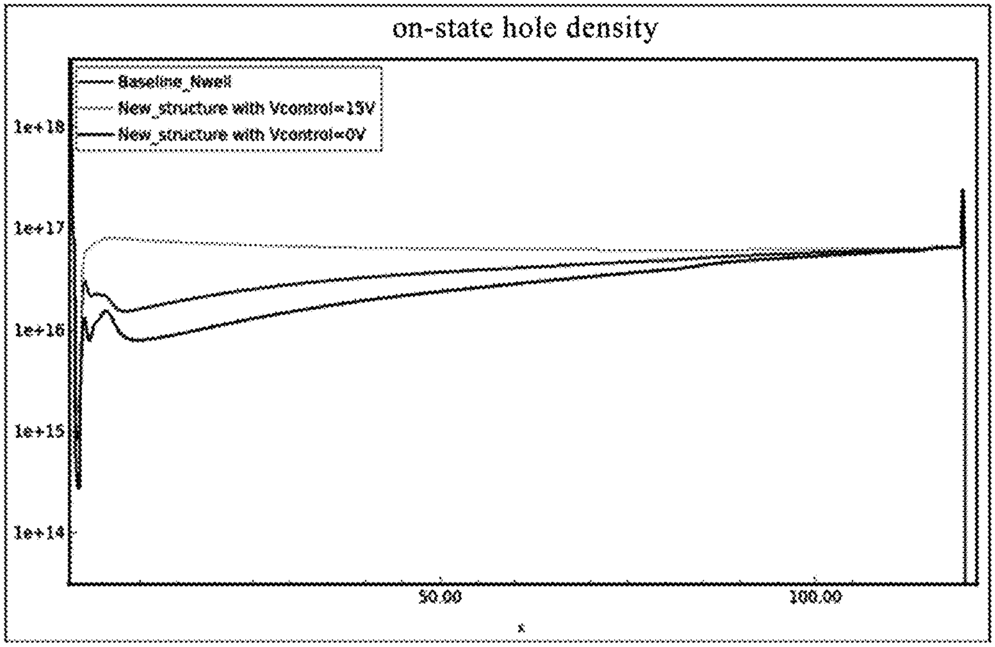
FIG. 12 shows a density distribution of minority holes in the on-state of the existing structure of FIG. 3A and the new structure of FIG. 3B of the present disclosure.

FIG. 12 shows a density distribution of minority holes in the on-state of the existing structure of FIG. 3A and the new structure of FIG. 3B of the present disclosure. The signal of the additional control gate (New_Nwell_struture_Vcontrol)

of the new structure includes 0V and 15V. As shown in FIG. 12, when the signal of the additional control gate is 15V, the density of minority holes is higher than the density of holes in the existing structure, the carrier storage capacity on the front side of the device is increased, and the conductance modulation effect in on-state is better than that of the prior art. When the signal of the additional control gate is 0V, the density of minority holes is lower than the density of holes in the existing structure, the carrier storage capability (implantation enhancement effect) on the front side of the device becomes weak, and the conductance modulation effect is weaker than that of the prior art. It can be seen by combining FIGS. 12 and 8 that, when the signal of the additional control gate is 15V, the Vcesat of the new structure is comparable to or better than the Vcesat of the prior art, and when the signal of the control gate is 0V, the Vcesat of the new structure is higher than that of the prior art.

Figure 13:
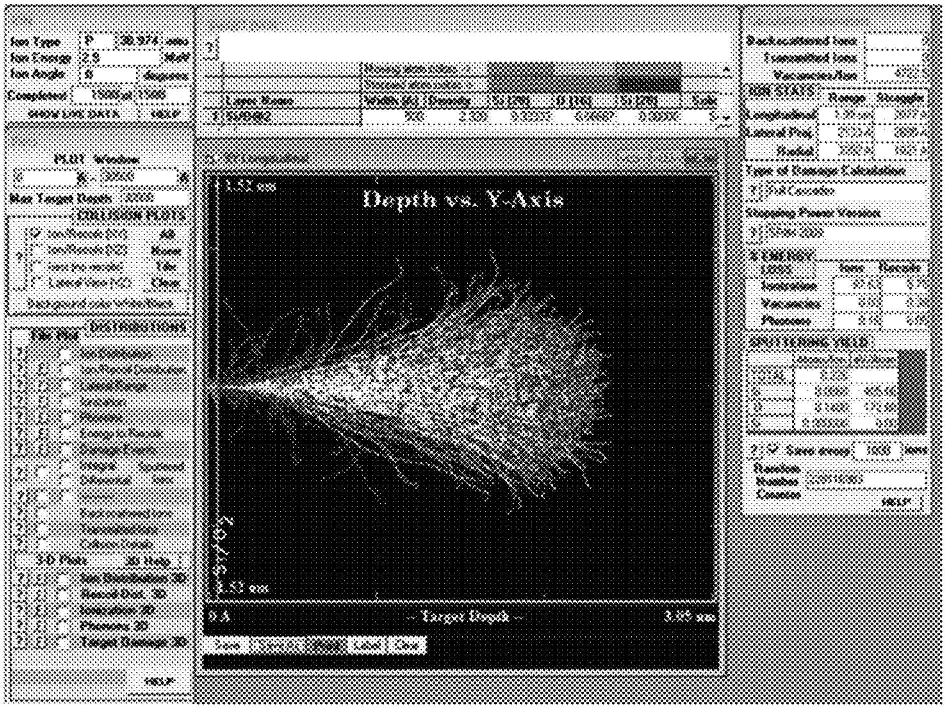
FIG. 13 shows an SRIM simulation result in the case of a phosphorous implantation with an energy of 2.5 MeV.
Figure 14:
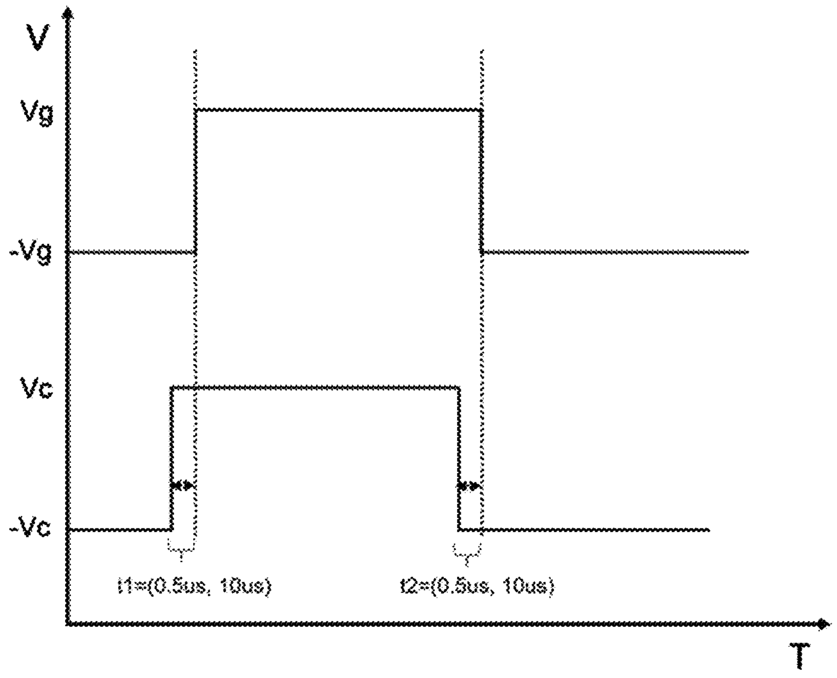
FIG. 14 shows signal waveforms of a gate and an additional control gate.

FIG. 13 shows an SRIM simulation result in the case of a phosphorous implantation with an energy of 2.5 MeV. It can be seen that the range of lateral distribution after phosphorus implantation is about 0.2 um. FIG. 14 shows signal waveforms of a gate and an additional control gate, in which Vg is a gate electrode, Vc is an additional control gate. The signal of the additional control gate Vc is 0.5 us-10 us ahead of the signal of the gate electrode Vg. In this way, during on-state or turn-on process, carrier storage capacity could be enhanced. During turn-off process, since the additional control gate is turned off in advance, the carriers could be accelerated through a minority carrier extraction channel to complete the carrier extraction process.

Finally, it should be noted that the above embodiments are merely exemplary embodiments adopted to explain the technical solutions of the present disclosure, but not to limit thereto. Although the present disclosure has been described in detail with reference to the foregoing embodiments, a person skilled in the art should understand that: various changes may still be made to the technical solutions recited in the above embodiments, or equivalents may be substituted for all or some of the features described in the foregoing embodiments, and such changes or substitutions do not make the spirit of corresponding technical solutions depart from the scope of the technical solutions of the embodiments of the present disclosure.

LIST OF REFERENCE SIGNS:

| components | reference signs |
|---|---|
| N-type drift layer | 11, 101 |
| N-type storage layer | 12, 102 |
| second N-type storage layer | 12a |
| P-type body layer | 13, 103 |
| second P-type body layer | 13a |
| N-type doped layer | 14, 104 |
| active region | 15 |
| gate trench | 16, 106 |
| gate trench shorted to an emitter | 107 |
| control gate trench | 17 |
| dielectric layer | 18 |
| trench | 19 |
| control gate | 20 |
| gate | 21 |
| back metal layer | 22 |
| gate oxide layer | 23 |
| front metal layer | 24 |
| first surface | 111 |
| second surface | 112 |
| third surface | 113 |

What is claimed is:

1. A cell structure of an insulated gate bipolar transistor, IGBT, with a control gate and a carrier storage layer, comprising:

an N-type drift layer with a first surface;

an active region located on a second surface opposing the first surface, and comprising an N-type storage layer, a P-type body layer and an N-type doped layer sequentially stacked in the active region from the first surface to the second surface; and at least three gate trench bodies, each of the at least three gate trench bodies extending from the second surface to the first surface in a first direction perpendicular to the first surface and contacting the N-type drift layer, and each of the at least three gate trench bodies being a gate trench or a control gate trench, wherein the gate trench has a sidewall that is in contact with the active region, and a sidewall of the control gate trench is in contact with the P-type body layer but not in contact with the N-type storage layer, wherein the sidewall of the control gate trench extends from the second surface to the first surface along the first direction perpendicular to the first surface, and sequentially contacts the P-type body layer and the N-type drift layer, and wherein the sidewall of the gate trench extends from the second surface to the first surface along the first direction perpendicular to the first surface, and sequentially contacts the N-type doped layer, the P-type body layer, the N-type storage layer, and the N-type drift layer, wherein when the at least three gate trench bodies are three gate trench bodies, the three gate trench bodies comprise two gate trenches and one control gate trench, the two gate trenches and the one control gate trench are arranged in a manner of gate trench-control gate trench-gate trench along a second direction parallel to the first surface and perpendicular to the first direction, and are spaced apart by the P-type body layer, and a distance between adjacent sidewalls of one of the gate trenches and the one control gate trench minus a width of the N-type storage layer between the gate trench and the one control gate trench is in the range of 0.2 um to 1 um.

2. The cell structure according to claim 1, wherein the gate trench body comprises a gate oxide layer located on a bottom surface and a sidewall of the gate trench body, and a conductive material surrounded by the gate oxide layer to form a control gate or a gate, and wherein the bottom surface of the gate trench body is distant from the first surface and the second surface in the first direction, and the control gate trench corresponds to the control gate, and the gate trench corresponds to the gate.

3. The cell structure according to claim 2, further comprising at least three dielectric layers with a third surface, wherein the third surface is farther from the first surface and the bottom surface of the gate trench body than the second surface in the first direction, the at least three dielectric layers are spaced apart by two trenches, and a front metal layer is disposed on the at least three dielectric layers and in the two trenches.

4. The cell structure according to claim 3, wherein the gate has a signal and the control gate has a signal that are respectively applied through the conductive material in the gate trench and the control gate trench, and the signal of the control gate is 0.5 us-10 us ahead of the signal of the gate.

5. The cell structure according to claim 1, wherein the distance between adjacent sidewalls of one of the gate trenches and the one control gate trench minus the width of the N-type storage layer between the gate trench and the one control gate trench is in the range of 0.2 um to 0.5 um.

6. The cell structure according to claim 1, further comprising a back metal layer formed on another surface of the N-type drift layer distant from the first surface, the back metal layer being configured as a collector.

7. The cell structure according to claim 1, wherein the N-type storage layer is formed by ion implantation technology with an implantation energy between 1.5 MeV and 4 MeV.

8. A method for manufacturing a cell structure of an insulated gate bipolar transistor, IGBT, with a control gate and a carrier storage layer, comprising the steps of:

forming an N-type drift layer with a first surface;

forming an active region on the first surface of the N-type drift layer, wherein the active region is located on a second surface opposing the first surface, the active region comprises an N-type storage layer, a P-type body layer and an N-type doped layer, and the N-type storage layer, the P-type body layer and the N-type doped layer are sequentially formed from the first surface to the second surface; and forming at least three gate trench bodies from the second surface to the first surface along a first direction perpendicular to the first surface, wherein each of the at least three gate trench bodies extends to and contacts the N-type drift layer, and each of the at least three gate trench bodies is a gate trench or a control gate trench, wherein the gate trench has a sidewall that is in contact with the active region, and a sidewall of the control gate trench is in contact with the P-type body layer but not in contact with the N-type storage layer, wherein the sidewall of the control gate trench extends from the second surface to the first surface along the first direction perpendicular to the first surface, and sequentially contacts the P-type body layer and the N-type drift layer, and the sidewall of the gate trench extends from the second surface to the first surface along the first direction perpendicular to the first surface, and sequentially contacts the N-type doped layer, the P-type body layer, the N-type storage layer, and the N-type drift layer, wherein when the at least three gate trench bodies are three gate trench bodies, the three gate trench bodies comprise two gate trenches and one control gate trench, the two gate trenches and the one control gate trench are arranged in a manner of gate trench-control gate trench-gate trench along a second direction parallel to the first surface and perpendicular to the first direction, and are spaced apart by the P-type body layer, and a distance between adjacent sidewalls of one of the gate trenches and the one control gate trench minus a width of the N-type storage layer between the gate trench and the one control gate trench is in the range of 0.2 um to 1 um.

9. The method according to claim 8, further comprising the steps of:

forming a gate oxide layer on a bottom surface and a sidewall of the gate trench body to form a control gate or a gate, the bottom surface of the gate trench body being distant from the first surface and the second surface in the first direction; and filling the gate trench body, on which the gate oxide layer is formed, with a conductive material, wherein the control gate trench corresponds to the control gate, and the gate trench corresponds to the gate.

10. The method according to claim 9, further comprising the steps of:

forming a dielectric layer with a third surface, wherein the third surface is farther from the first surface and the bottom surface of the gate trench body than the second surface in the first direction, the dielectric layer is formed from the second surface to the third surface;

etching the dielectric layer from the third surface to the second surface along the first direction perpendicular to the first surface to form two trenches which split the dielectric layer, and etching each of the two trenches into the P-type body layer; and forming a front metal layer on a split dielectric layer and in the two trenches.

11. The method according to claim 10, wherein the gate has a signal and the control gate has a signal that are respectively applied through the conductive material in the gate trench, and the signal of the control gate is 0.5 us to 10 us ahead of the signal of the gate electrode.

12. The method according to claim 8, wherein the distance between adjacent sidewalls of one of the gate trenches and the one control gate trench minus the width of the N-type storage layer between the gate trench and the one control gate trench is in the range of 0.2 um to 0.5 um.

13. The method according to claim 10, wherein etching each of the two trenches into the P-type body layer comprises etching each of the two trenches into the P-type body layer to the same depth as the N-type doped layer.

14. The method according to claim 8, wherein the N-type storage layer is formed by ion implantation technology with an implantation energy between 1.5 MeV and 4 MeV.

15. The method according to claim 8, further comprising forming a back metal layer on another surface of the N-type drift layer distant from the first surface and forming the back metal layer as a collector.

* * * * *